US008384348B2

(12) United States Patent
Tin

(10) Patent No.: US 8,384,348 B2
(45) Date of Patent: Feb. 26, 2013

(54) TOUCH-SWITCHABLE USB CHARGING RECEPTACLE

(75) Inventor: Jane Pin Tin, Taipei County (TW)

(73) Assignee: Kyohaya Technology Ltd., New Taipei (TW)

( * ) Notice: Subject to any disclaimer, the term of this patent is extended or adjusted under 35 U.S.C. 154(b) by 344 days.

(21) Appl. No.: 12/948,207

(22) Filed: Nov. 17, 2010

(65) Prior Publication Data

US 2012/0119695 A1    May 17, 2012

(51) Int. Cl.
  *H02J 7/02*  (2006.01)
  *H02J 7/00*  (2006.01)
(52) U.S. Cl. ......... 320/111; 320/114; 307/140; 307/141
(58) Field of Classification Search ............. 320/107, 320/111, 114, 128, 137; 307/2, 99, 112, 307/116, 134, 140, 141; 361/139, 600, 601, 361/679.01
See application file for complete search history.

(56) References Cited

U.S. PATENT DOCUMENTS

| | | | | |
|---|---|---|---|---|
| 2011/0187323 A1* | 8/2011 | Gourley | ................. | 320/111 |
| 2012/0056492 A1* | 3/2012 | Carson et al. | ................. | 307/116 |
| 2012/0056493 A1* | 3/2012 | Carson et al. | ................. | 307/116 |
| 2012/0056494 A1* | 3/2012 | Carson et al. | ................. | 307/116 |
| 2012/0056495 A1* | 3/2012 | Carson et al. | ................. | 307/117 |
| 2012/0061480 A1* | 3/2012 | Deligiannis et al. | ............ | 236/51 |

\* cited by examiner

*Primary Examiner* — Richard V Muralidar
(74) *Attorney, Agent, or Firm* — Rabin & Berdo, P.C.

(57) ABSTRACT

A touch-switchable USB charging receptacle includes a rectifying and transforming circuit connected to a public power supply for converting AC power into DC power and supplying the latter to DC devices, such as mobile phones, MP3 players, video games, personal digital assistants, etc.; a power supply connector and an illuminating indicator module electrically connected to the rectifying and transforming circuit to obtain power supply; an integrally formed cover plate isolating the rectifying and transforming circuit, the power supply connector and the illuminating indicator module from external environment; and a touch switch located behind the cover plate and electrically connected to the rectifying and transforming circuit for controlling a power supply state of the latter. The illuminating indicator module emits indicating light, which is visible via a light-pervious indicator provided on the cover plate. Therefore, the cover plate is not only water-retardant but also capable of indicating a power supply state.

9 Claims, 6 Drawing Sheets

US 8,384,348 B2

TOUCH-SWITCHABLE USB CHARGING RECEPTACLE

FIELD OF THE INVENTION

The present invention relates to a DC power supply receptacle installed on a wall, and more particularly to a touch-switchable Universal Serial Bus (USB) charging receptacle including an integrally formed cover plate and a touch switch located behind the cover plate, so that external foreign matters and moisture are stopped by the cover plate from invading into the charging receptacle and a user can conveniently control the DC power supply by touching the cover plate.

BACKGROUND OF THE INVENTION

To minimize the electric energy loss during the course of power transmission via power lines, all the electrical grids over the world transmit electricity in the form of high-voltage alternating current (AC), which is stepped down at a substation near the consumers to a required working voltage for general domestic electrical appliances. Therefore, electrical networks for city and rural areas use AC power receptacles as their terminals.

In the past decades of years, technological development is so rapid that various types of digitalized electronic products, such as computers and communication apparatus, have been introduced into market and people's daily life. These digitalized electronic products are constantly personalized and miniaturized, and usually use the small-volume and rechargeable direct current (DC) battery as their power supply, so that the electronic products have further miniaturized dimensions and reduced weight and can be conveniently portable.

The above-mentioned personalized electronic products could not be directly powered or charged via the AC power receptacles that currently form the terminals of the electrical grids. Before the AC power supplied via the power lines can be supplied to power or charge a DC device, the AC power must be rectified, stepped down and stabilized via a rectifier to convert into DC power. However, since various types of electronic products respectively require a specific DC voltage, consumers must prepare many rectifiers of different voltages for different electronic products. This is of course very inconvenient to consumers.

One solution to this problem is to install a rectifying and transforming circuit in an electrical receptacle for converting the AC power supplied via the power lines into DC power and then outputting the converted DC power for use. To avoid waste of energy possibly caused by turning on the rectifying and transforming circuit over a long period of time, the electrical receptacle installed with the rectifying and transforming circuit is usually provided on a cover plate thereof with a control switch. When this type of electrical receptacle is mounted in an outdoor environment or a wet environment, such as in a kitchen or in a bathroom, water would invade into the electrical receptacle via gaps between the control switch and the cover plate to corrode the control switch as well as the rectifying and transforming circuit in the receptacle. In view of this shortcoming, it is necessary to improve the existing electrical receptacle that supplies DC power.

SUMMARY OF THE INVENTION

A primary object of the present invention is to provide a touch-switchable USB charging receptacle, which includes a rectifying circuit provided in the receptacle for converting AC power supplied via general power lines into DC power and allows a user to directly supply the DC power to general digitalized electronic products simply by touching a cover plate of the receptacle to actuate a touch switch behind the cover plate.

Another object of the present invention is to provide a touch-switchable USB charging receptacle, which includes a touch zone provided on a cover plate of the receptacle for actuating a switch module located behind the cover plate, so that a user may conveniently control the touch module to switch to a DC power supply state. With the cover plate provided with a touch zone and the switch module located behind the cover plate, no gap will be formed on the cover plate because there is not any conventional control switch provided on the cover plate, and external foreign matters are therefore prevented from invading into the receptacle via the cover plate.

A further object of the present invention is to provide a touch-switchable USB charging receptacle, which includes an illuminating indicator module provided within a display zone on a cover plate of the receptacle, and indicating light emitted from the illuminating indicator module for indicating a power supply state of the receptacle is visible at the display zone, allowing a user to easily recognize the power supply state and the position of the receptacle in a dark environment or in night to largely upgrade the utility and performance of the DC power supply receptacle.

To achieve the above and other objects, the touch-switchable USB charging receptacle according to the present invention is connected to an AC public power supply for rectifying and transforming the AC power into DC power, which can be supplied to a mobile phone, a personal digital assistant (PDA) and other DC devices for use. The touch-switchable USB charging receptacle according to the present invention includes at least a cover plate, an illuminating indicator module, a power supply module, and a switch module.

The power supply module includes at least one rectifying and transforming circuit, a power supply control circuit, and at least one power supply connector. The rectifying and transforming circuit is electrically connected to the AC public power supply for rectifying and transforming the AC power supply into DC power supply and then supplying the converted DC power supply to the power supply control circuit, the switch module, and the power supply connector.

The power supply control circuit includes a timer and is capable of controlling a power supply state, so as to control the state of power supply to the at least one power supply connector.

The power supply connector is connected to a feedback controller; and the feedback controller is capable of detecting a power level of an object being charged and sending a power supply stop signal to the power supply control circuit when the object is fully charged.

The cover plate is assembled to an outer side of a recess formed on a wall, and is formed on a front face with at least one display zone, at least one power supply connection opening, and a touch zone. The display zone is provided therein with at least a light-pervious indicator, via which indicating light emitted from the illuminating indicator module is visible on the front face of the cover plate to indicate a current power supply state and allow a user to conveniently recognize the position of the USB charging receptacle. And, the power supply connection opening is aligned and engaged with the power supply connector.

The switch module is assembled to and located within the touch zone and is connected to the power supply control circuit, so that a user can control and change the power supply state to on or off by touching the touch zone. The illuminating indicator module is assembled to behind the display zone and including at least one light emitting unit for emitting and projecting the indicating light onto the display zone, so that the indicating light is always visible on the front face of the cover plate.

In a preferred embodiment of the present invention, the power supply module includes a first and a second rectifying and transforming circuit independent of each other. The first rectifying and transforming circuit converts the AC power supply into DC power supply and supplies the converted DC power to the power supply control circuit, which is electrically connected to the illuminating indicator module.

The second rectifying and transforming circuit also converts the AC power supply into DC power supply, and the converted DC power supply independently serves as a power output for use. The second rectifying and transforming circuit is electrically connected to the power supply connector, and the power supply control circuit controls the state of power supply from the second rectifying and transforming circuit to the power supply connector.

In the above preferred embodiment, the switch module is in the form of a touch switch button and located behind the touch zone of the cover plate to isolate from an external environment outside the cover plate. When a user touches the cover plate, the touch switch button located behind the cover plate is actuated to control the power supply module to on or off.

In another preferred embodiment, the display zone and the touch zone overlap with each other for indicating the position of the touch zone; and the indicator is a light-pervious groove sunken from a rear face of the cover plate and therefore has higher light transmittance than other portion of the cover plate. Further, the light-pervious groove is designed as a power sign.

In still another preferred embodiment, the power supply connector is a USB connector, and the light emitting unit includes at least one light-emitting diode.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The present invention will now be described with some preferred embodiments thereof and with reference to the accompanying drawings.

Figure 1:
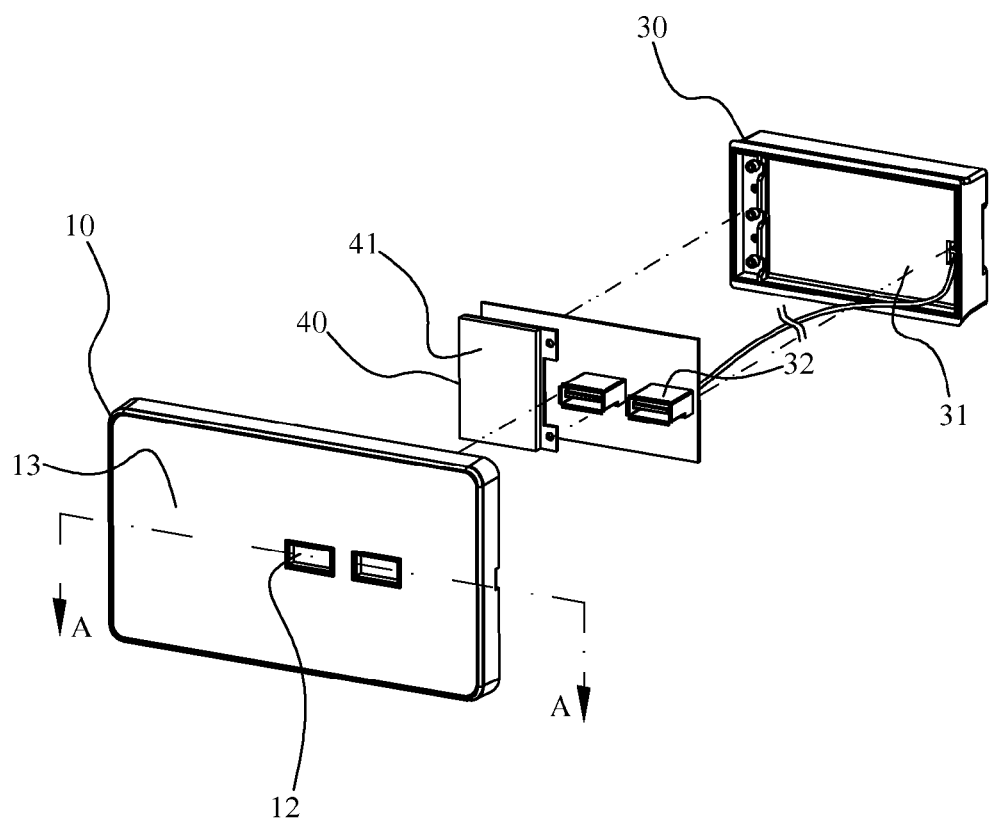
FIG. 1 is an exploded perspective view showing the manner of assembling a touch-switchable USB charging receptacle according to the present invention.
Figure 2:
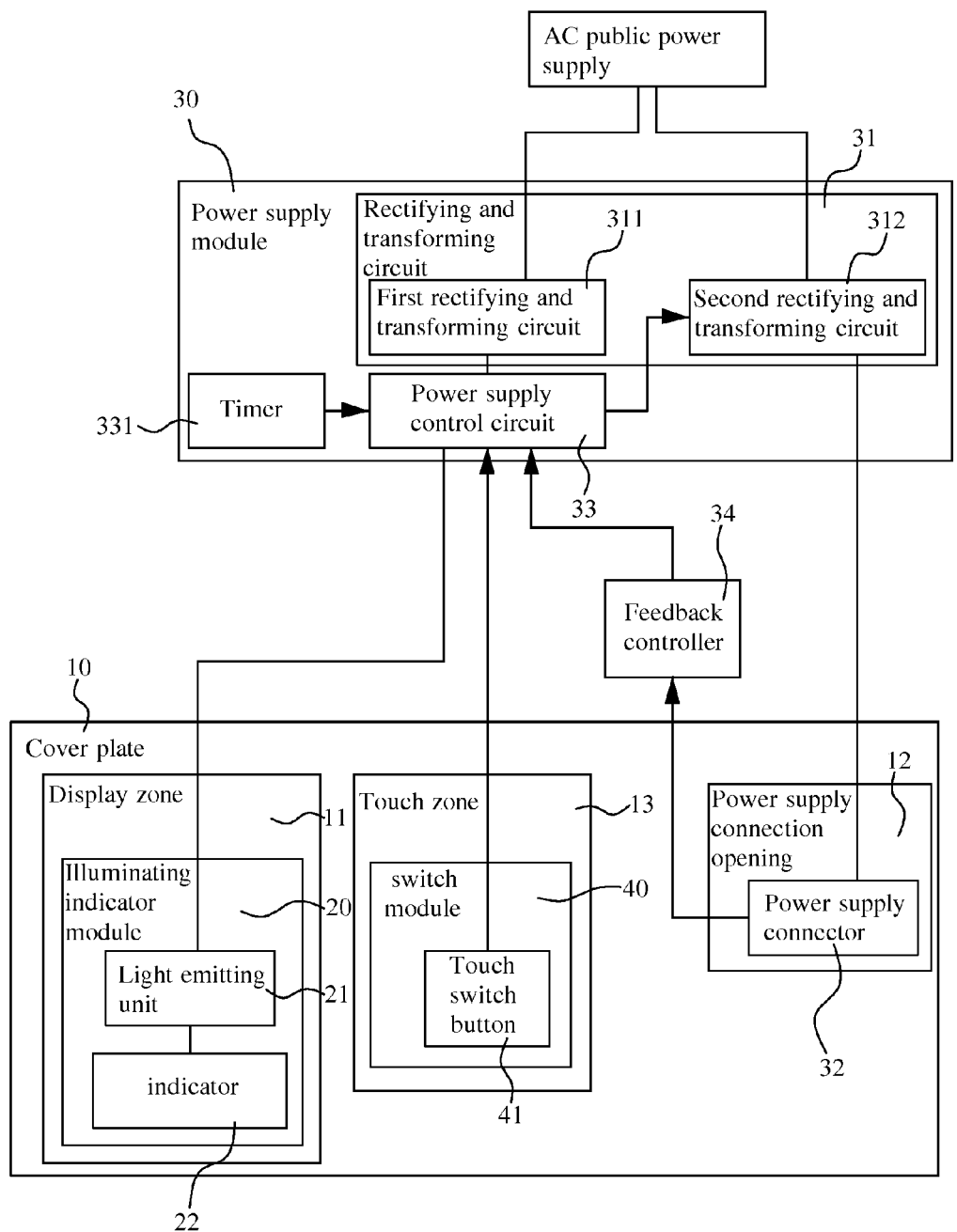
FIG. 2 is a block diagram showing the connection of different elements and the transmission of control signals in the present invention.
Figure 3:
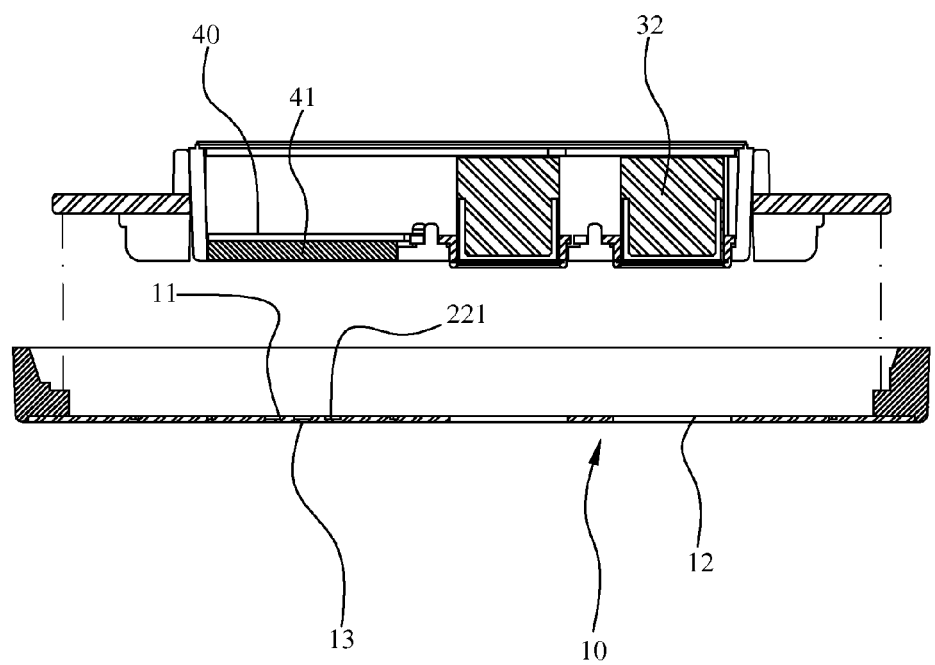
FIG. 3 is a sectional view taken along line A-A of FIG. 1.

Please refer to FIGS. 1 to 3. A touch-switchable USB charging receptacle according to the present invention is mounted in a recess provided on a wall for connecting to a power line, and includes at least a cover plate 10, an illuminating indicator module 20, a power supply module 30, and a switch module 40.

The power supply module 30 includes at least a rectifying and transforming circuit 31, a power supply control circuit 33, and at least a power supply connector 32. The rectifying and transforming circuit 31 is electrically connected to a public power supply for rectifying and transforming alternating current (AC) power supply into direct current (DC) power supply, and then supplying the converted DC power to the power supply control circuit 33, the switch module 40, and the at least one power supply connector 32.

The power supply control circuit 33 includes a timer 331 and has the function of controlling power supply state, so as to control the power supply state of the at least one power supply connector 32.

The at least one power supply connector 32 is connected to a feedback controller 34, which detects the power level of an object being charged. When the object is fully charged, the feedback controller 34 feeds back a power supply stop signal to the power supply control circuit 33.

The cover plate 10 is assembled to an outer side of the recess provided on the wall, and is formed on a front face with at least a display zone 11, a power supply connection opening 12, and a touch zone 13. Within the display zone 11, there is provided at least one light-pervious indicator 22, so that indicating light emitted from the illuminating indicator module 20 is always visible on the cover plate 10 via the indicator 22 to indicate the power supply state and allow a user to conveniently recognize the position of the receptacle. The power supply connection opening 12 is aligned and engaged with the power supply connector 32.

The switch module 40 is assembled to and located within the touch zone 13 and is connected to the power supply control circuit 33, so that a user can control and change the power supply state to on or off by touching the touch zone 13. The illuminating indicator module 20 is located behind the display zone 11 and includes at least one light emitting unit 21 for emitting and projecting the indicating light onto the display zone 11, so that the indicating light is always visible on the front face of the cover plate 10.

In a preferred embodiment of the present invention, the power supply module 30 includes a first rectifying and transforming circuit 311 as well as a second rectifying and transforming circuit 312 that are independent of each other. The first rectifying and transforming circuit 311 converts AC power into DC power and the converted DC power is supplied to the power supply control circuit 33, which is electrically connected to the illuminating indicator module 20 and can therefore supply the DC power to the illuminating indicator module 20.

The second rectifying and transforming circuit 312 also converts AC power into DC power, and the converted DC power independently serves as a power output for use. The second rectifying and transforming circuit 312 is electrically connected to the power supply connector 32, and the power supply control circuit 33 controls the state of power supply from the second rectifying and transforming circuit 312 to the power supply connector 32.

Figure 4:
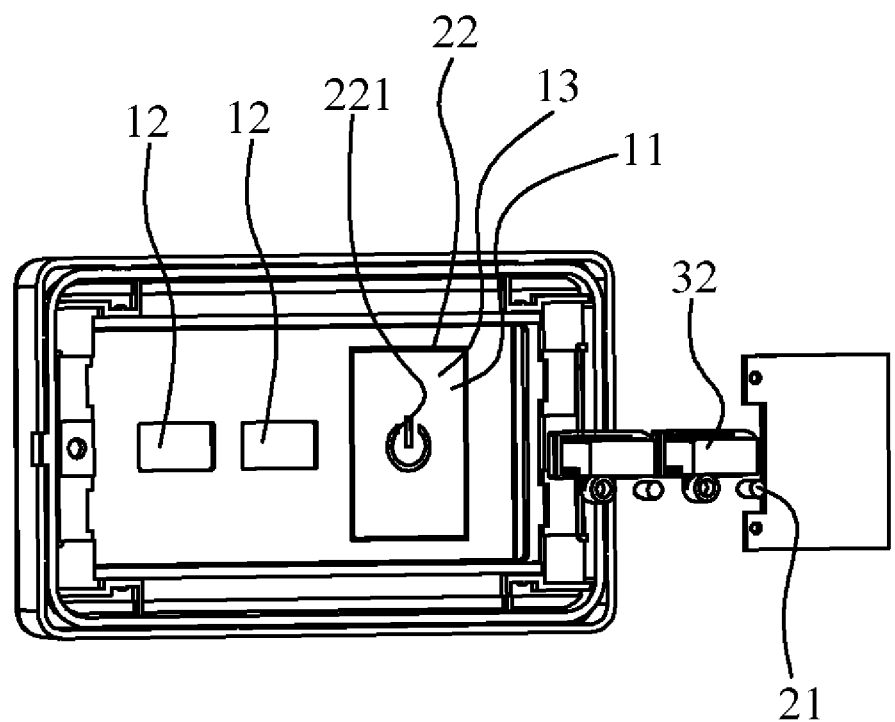
FIG. 4 is a rear view of a cover plate and an illuminating indicator module included in the present invention.

Please refer to FIGS. 3 and 4. In the illustrated preferred embodiment, the switch module 40 is in the form of a touch switch button 41 located behind the touch zone 13 of the cover plate 10 to isolate from the external environment outside the cover plate 10. When the user touches the front face of the cover plate 10, the touch switch button 41 behind the cover plate 10 is actuated to thereby control the power supply module 30 to on or off.

In another preferred embodiment of the present invention, the display zone 11 and the touch zone 13 overlap with each other, so as to indicate the position of the touch zone 13. Meanwhile, the indicator 22 is in the form of a light-pervious groove 221 sunken from a rear face of the cover plate 10. Since the groove 221 is sunken from the rear face of the cover plate 10, it has higher light transmittance than other portion of the cover plate 10. Further, the light-pervious groove 221 is designed as a power sign.

In still another preferred embodiment, the power supply connector 32 is a Universal Serial Bus (USB) connector, and the light emitting unit 21 includes at least one light emitting diode (LED) and has at least two illuminating modes. The light emitting unit 21 switches between different illuminating modes according to different power supply states.

The power supply control circuit 33 has the function of controlling power supply state and includes a timer 331. The power supply control circuit 33 supplies the converted DC power to the illuminating indicator module 20, the switch module 40 and the power supply connector 32. Therefore, the switch module 40 and the illuminating indicator module 20 included in the present invention can obtain power supply directly from the power line without the need of connecting to other additional power source. The at least one power supply connector 32 is connected to the feedback controller 34, which is able to detect whether an object being charged has been fully charged and to feed back a power supply stop signal to the power supply control circuit 33 when the object is fully charged.

The cover plate 10 is assembled to the outer side of the recess provided on the wall, and is formed on the front face thereof with at least a display zone 11, a power supply connection opening 12, and a touch zone 13. The display zone 11 displays the power supply state and allows a user to conveniently recognize the position of the receptacle. The at least one power supply connection opening 12 is aligned and engaged with the at least one power supply connector 32, and there is at least one light-pervious indicator 22 provided within the display zone 11.

The switch module 40 is electrically connected to the power supply control circuit 33 in the power supply module 30, and is connected to the touch zone 13 on the cover plate 10, such that the power supply can be turned on or off when a user touches the cover plate 10. The illuminating indicator module 20 is electrically connected to the power supply control circuit 33 in the power supply module 30, and is located behind the display zone 11. The illuminating indicator module 20 includes at least one light emitting unit 21 for emitting and projecting indicating light onto the display zone 11, so that the indicating light is always visible on the front face of the cover plate 10.

Please refer to FIGS. 3 and 4 again. The switch module 40 in the preferred embodiment illustrated in FIGS. 3 and 4 is in the form of a touch switch button 41, which is located behind the touch zone 13 of the cover plate 10 and is therefore isolated from external environment outside the cover plate 10. With the cover plate 10 that is a complete piece without forming any gap thereon, it is able to effectively prevent external foreign matters from invading into the receptacle to adversely corrode the touch switch button 41 and cause failure thereof even if the touch-switchable USB charging receptacle of the present invention is installed in an outdoor environment or in an environment subjected to dust and moisture. When the user touches the touch zone 13 on the cover plate 10, the touch switch button 41 located behind the cover plate 10 is actuated at the same time to thereby control the power supply module 30 to on or off.

In the above-described embodiment, the display zone 11 and the touch zone 13 overlap with each other, so as to indicate the position of the touch zone 13. Meanwhile, the indicator 22 is in the form of a light-pervious groove 221 sunken from a rear face of the cover plate 10. Since the groove 221 is sunken from the rear face of the cover plate 10 to have a reduced thickness, it has higher light transmittance than other portion of the cover plate 10. Further, the light-pervious groove 221 is designed as a power sign.

Moreover, the power supply connector 32 is a USB connector, and the light emitting unit 21 includes at least one light emitting diode (LED) and has at least two illuminating modes. The light emitting unit 21 switches between different illuminating modes according to different power supply states.

Figure 5:
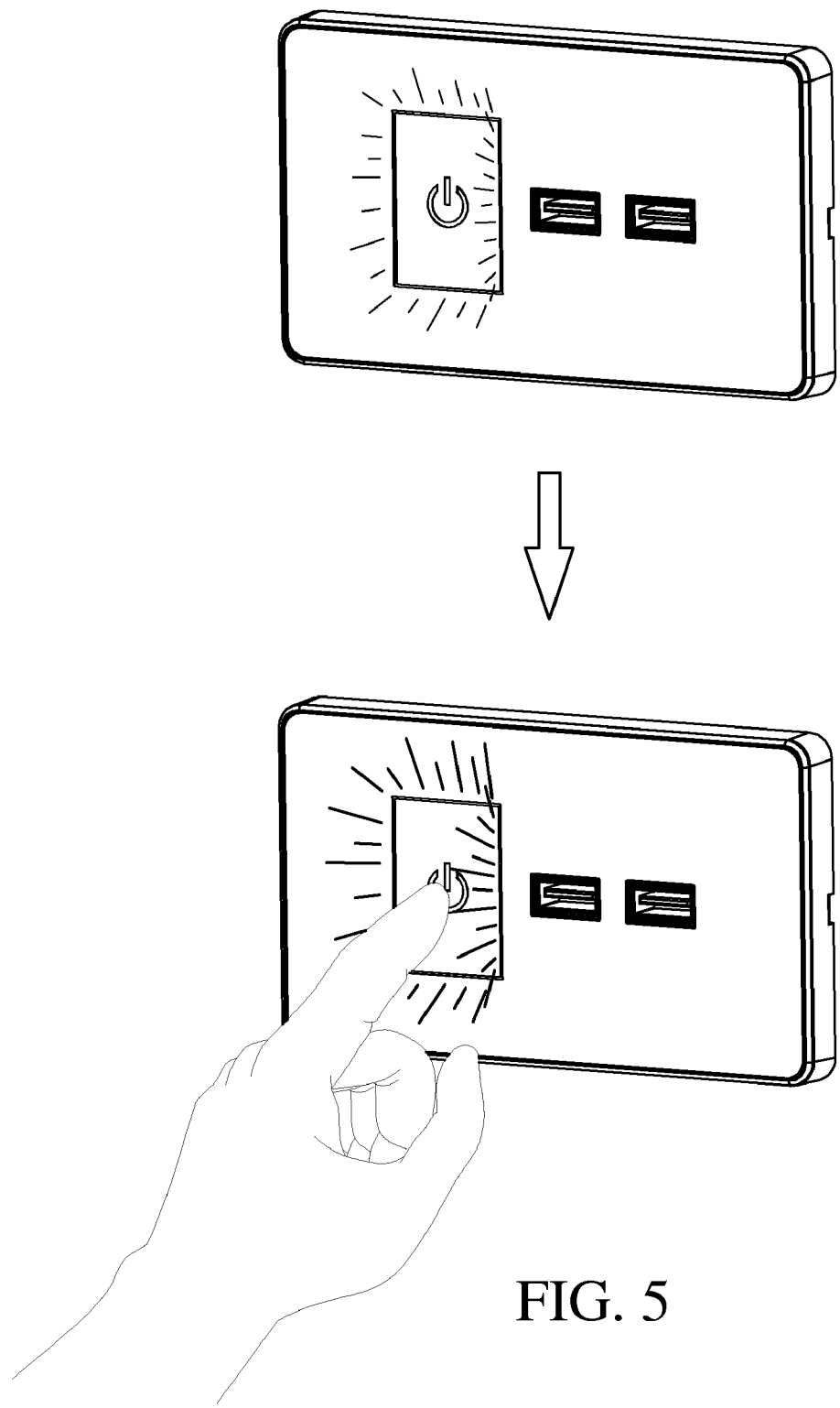
FIG. 5 shows a light emitting unit in the present invention is switchable between different illuminating modes according to different power supply states.

Please refer to FIG. 5. According to the preferred embodiment illustrated in FIG. 5, the light emitting unit 21 includes two light-emitting diodes of different colors. When the power supply module 30 is set to different power supply states for supplying or not supplying power to the power supply connector 32, the power supply control circuit 33 adjusts its state of power supply to the light emitting unit 21 and causes one of the color light-emitting diodes corresponding to the current power supply state to emit indicating light of a specific color. From the color of the emitted indicating light, the user can clearly know the current power supply state.

Figure 6:
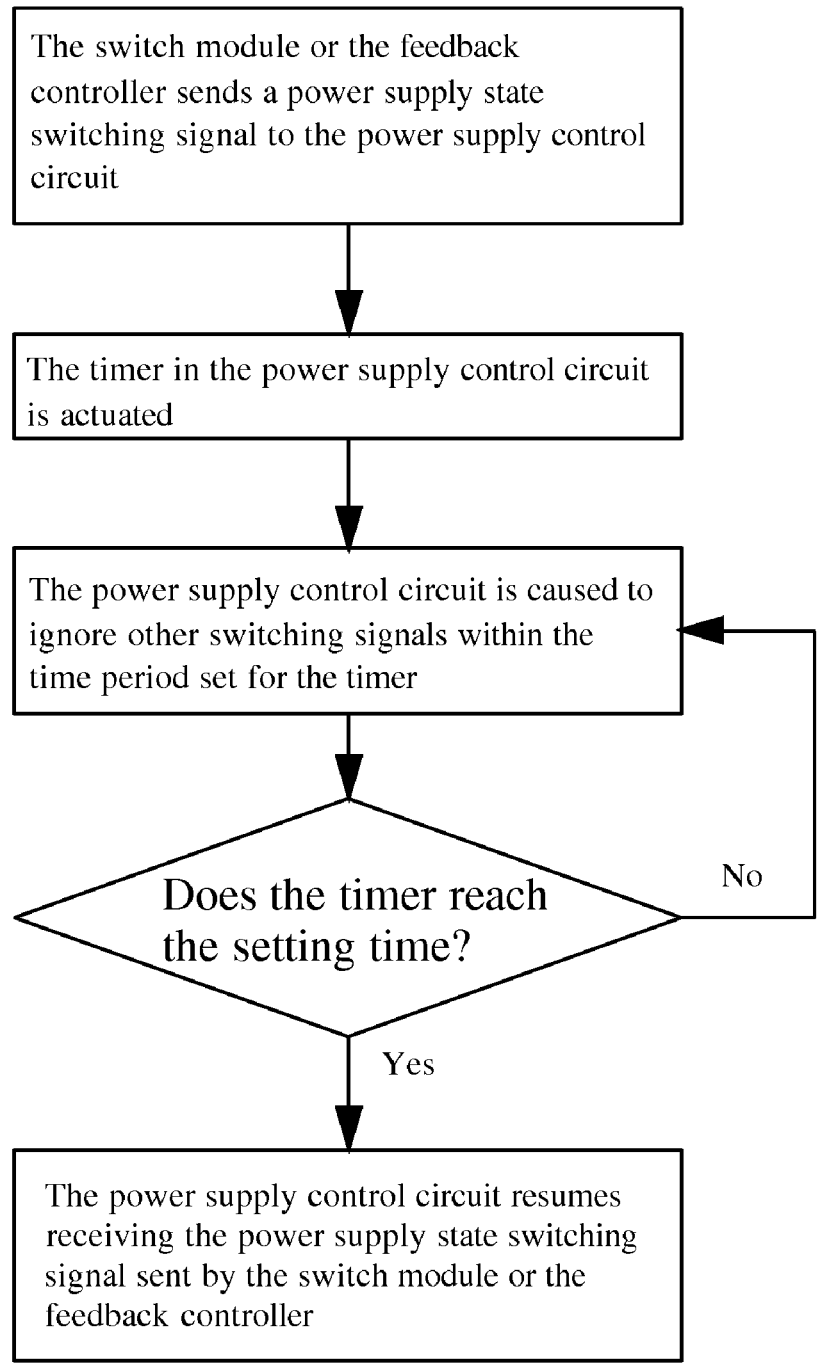
FIG. 6 is a flowchart showing how a power supply control circuit in the present invention determines the frequency of switching the power supply state.

FIG. 6 is a flowchart showing how the power supply control circuit in the present invention determines the frequency of switching the power supply state. To avoid excessively frequent switching between different power supply states to cause abnormality of the power supply control circuit 33, the sending of a power supply state switching signal by the switch module 40 or the feedback controller 34 to the power supply control circuit 33 will actuate the timer 331 in the power supply control circuit 33. At this point, the power supply control circuit 33 will ignore other switching signals within the time period set for the timer. That is, once the timer 331 is actuated, the power supply control circuit 33 will not accept other power supply state switching signal sent by the switch module 40 or the feedback controller 34 until the timer 331 reaches the setting time.

In conclusion, by utilizing the effect of the rectifying and transforming circuit, the present invention allows a user to directly use DC power from an electric receptacle to charge various kinds of digitalized electronic products, including computers and communication apparatus, without the need of preparing additional rectifiers.

Furthermore, the illuminating indicator module in the present invention also obtains power supply directly from the above-mentioned rectifying and transforming circuit. To install and use the present invention, simply connect the rectifying and transforming circuit to the AC power supply of the power line. And, the installation is very easy.

In the present invention, since the touch switch button is located behind the cover plate without being in direct contact with the external environment outside the cover plate, the touch switch can have extended service life.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A touch-switchable USB charging receptacle, comprising a cover plate, an illuminating indicator module, a power supply module, and a switch module;

the power supply module including at least one rectifying and transforming circuit, a power supply control circuit, and at least one power supply connector; the rectifying and transforming circuit being electrically connected to an AC public power supply for rectifying and transforming the AC power supply into DC power supply and then supplying the converted DC power supply to the power supply control circuit, the switch module, and the at least one power supply connector; and the power supply control circuit including a timer and being capable of controlling a power supply state, so as to control the state of power supply to the at least one power supply connector;

the cover plate being assembled to an outer side of a recess formed on a wall, and being formed on a front face with at least a display zone, a power supply connection opening, and a touch zone; the display zone being provided therein with at least a light-pervious indicator, via which indicating light emitted from the illuminating indicator module is always visible on the front face of the cover plate to indicate a power supply state and allow a user to conveniently recognize the position of the USB charging receptacle; and the power supply connection opening being aligned and engaged with the at least one power supply connector;

the switch module being assembled to and located within the touch zone and being connected to the power supply control circuit, so that a user can control and change the power supply state to on or off by touching the touch zone to actuate the switch module; and the illuminating indicator module being assembled to behind the display zone and including at least one light emitting unit.

2. The touch-switchable USB charging receptacle as claimed in claim 1, wherein the power supply module includes a first and a second rectifying and transforming circuit that are independent of each other; the first rectifying and transforming circuit converting the AC power supply into DC power supply and supplying the converted DC power to the power supply control circuit, which is electrically connected to the illuminating indicator module; the second rectifying and transforming circuit also converting the AC power supply into DC power supply, and the converted DC power supply independently serving as a power output for use; the second rectifying and transforming circuit being electrically connected to the at least one power supply connector, and the power supply control circuit controlling the state of power supply from the second rectifying and transforming circuit to the at least one power supply connector.

3. The touch-switchable USB charging receptacle as claimed in claim 1, wherein the at least one power supply connector is connected to a feedback controller; the feedback controller being capable of detecting whether an object being charged has been fully charged, and sending a power supply stop signal to the power supply control circuit when the object is fully charged.

4. The touch-switchable USB charging receptacle as claimed in claim 1, wherein the switch module is in the form of a touch switch button and located behind the touch zone of the cover plate to isolate from an external environment outside the cover plate.

5. The touch-switchable USB charging receptacle as claimed in claim 1, wherein the display zone and the touch zone overlap with each other.

6. The touch-switchable USB charging receptacle as claimed in claim 1, wherein the indicator is in the form of a light-pervious groove sunken from a rear face of the cover plate.

7. The touch-switchable USB charging receptacle as claimed in claim 5, wherein the light-pervious groove is designed as a power sign.

8. The touch-switchable USB charging receptacle as claimed in claim 1, wherein the at least one power supply connector is a USB connector.

9. The touch-switchable USB charging receptacle as claimed in claim 1, wherein the light emitting unit includes at least one light-emitting diode (LED).

* * * * *